US007016817B2

(12) United States Patent
Friedman et al.

(10) Patent No.: US 7,016,817 B2
(45) Date of Patent: Mar. 21, 2006

(54) METHOD FOR ELEVATOR CAB INTERIOR

(76) Inventors: Harold S. Friedman, 7 Gracie Square, New York, NY (US) 10028; Jeffrey Friedman, 33 Riverside Dr., New York, NY (US) 10023

( * ) Notice: Subject to any disclaimer, the term of this patent is extended or adjusted under 35 U.S.C. 154(b) by 434 days.

(21) Appl. No.: 10/294,026

(22) Filed: Nov. 14, 2002

(65) Prior Publication Data

US 2004/0098234 A1    May 20, 2004

(51) Int. Cl.
    *G06F 17/50* (2006.01)
(52) U.S. Cl. .............................. 703/1; 52/30; 187/401
(58) Field of Classification Search ................ 703/1; 52/30, 274, 235; 182/141; 187/414, 401; 446/137; 348/739; 382/100
    See application file for complete search history.

(56) References Cited

U.S. PATENT DOCUMENTS

| 3,621,635 | A | * | 11/1971 | De Lange ................... 52/235 |
| 3,631,942 | A | * | 1/1972 | Brounn ....................... 187/401 |
| 3,849,930 | A | * | 11/1974 | Stubbmann ................ 446/137 |
| 4,357,993 | A | * | 11/1982 | Halpern et al. ............ 187/401 |
| 5,207,295 | A | * | 5/1993 | Bialy et al. ................. 187/401 |
| 5,881,519 | A | * | 3/1999 | Newkirk ...................... 52/274 |
| 6,122,391 | A | * | 9/2000 | Ringland et al. ........... 382/100 |
| 6,631,589 | B1 | * | 10/2003 | Friedman et al. ............ 52/30 |
| 2002/0113909 | A1 | * | 8/2002 | Sherwood ................... 348/739 |

OTHER PUBLICATIONS

Harper, G.N. BOP-An Approach to Building Optimization, Proceedings of the 1968 23rd ACM National Conference, Jan. 1968, pp. 575-583.*
Turnage, R.B. A Methodology for Evaluation of a Hospital's Vertical Transportation Needs, Proceedings of the 11th Conference on Winter Simulation, vol. 2, pp. 595-602.*
AutoDesk Inc., AutoCad 14, User's Guide, Copyright 1998 AutoDesk Inc., pp. 8, 9, 25, 210, 602, 630 and 690.*

* cited by examiner

*Primary Examiner*—Russell Frejd

(57) ABSTRACT

An Elevator cab design process for providing an attractive appearance complementary to a building in which the elevator is installed, by
 a) Evaluating a building for determination of appropriate elevator cab interior design architecture and appearance'
 b) Selecting a suitable design from a Series of previously prepared Design proposals
 c) Selecting material for the declaration of the cab interior for the design selected from a palette of previously prepared options for available material including selection of material type, color and design.

18 Claims, 18 Drawing Sheets

NATIONAL ELEVATOR SCHEME R-4

CEILING

SIDE ELEV

ELEVATION

SIDE ELEV

PLAN

NATIONAL ELEVATOR
SCHEME R-3

KPF

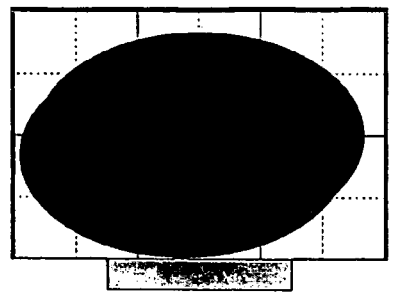
CEILING
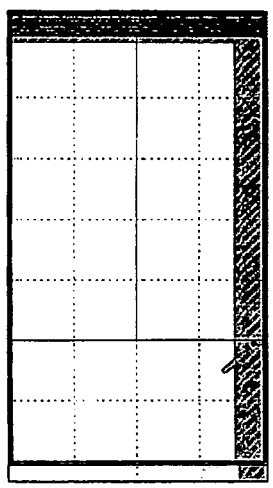 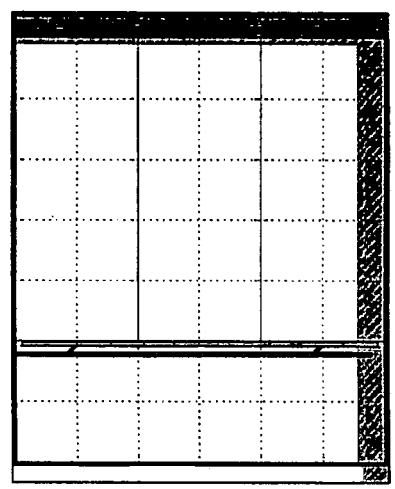 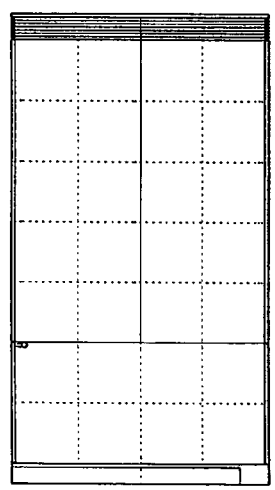
SIDE ELEV   ELEVATION   SIDE ELEV
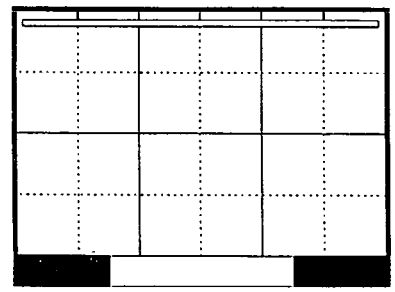
PLAN
NATIONAL ELEVATOR
SCHEME R-1   FIG. 14c   KPF

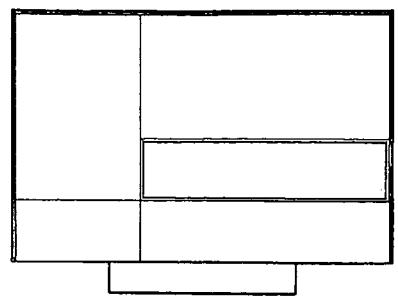
CEILING
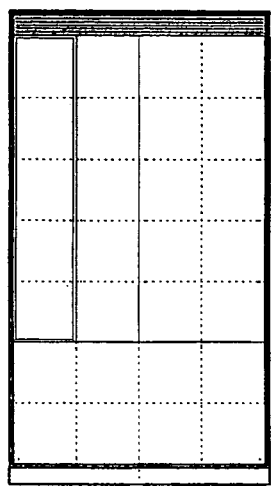 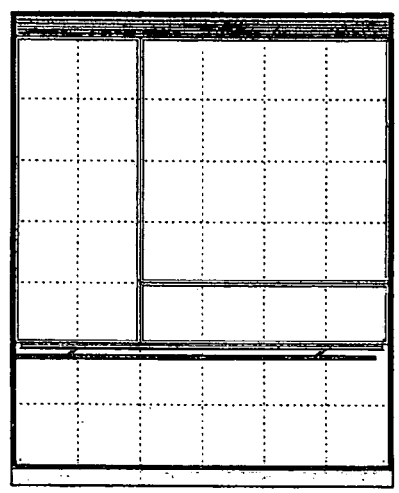 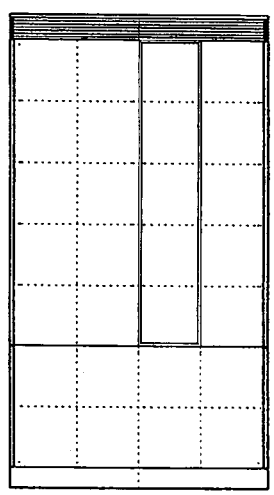
SIDE ELEV    ELEVATION    SIDE ELEV
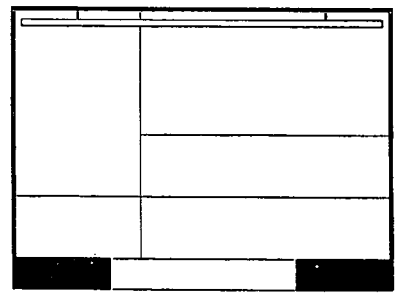
PLAN
NATIONAL ELEVATOR
SCHEME R-2             FIG. 14d             KPF

CEILING

SIDE ELEV

ELEVATION

SIDE ELEV

PLAN

NATIONAL ELEVATOR
SCHEME R-5

KPF

METHOD FOR ELEVATOR CAB INTERIOR

FIELD OF INVENTION

The present invention relates to building construction and more particularly to an advantageous method of designing and constructing an attractive elevator cab at a reduced cost. This elevator cab design method reduces the burden, time commitment and cost of designing, manufacturing and installing a custom elevator cab.

BACKGROUND OF THE INVENTION

Traditional Methods of Cab Selection

Traditionally, there are three methods by which an elevator cab design is chosen. The method of selection is usually determined by the quality of the building: Rated from A down to C as illustrated below:

|  | "A" Building | "B" Building | "C" or Lesser |
|---|---|---|---|
| 1) Stock elevator or other traditional designs |  | 40% | 75% |
| 2) "Make it look like that building" |  | 40% | 25% |
| 3) Hire architect to make new design | 100% | 20% |  |

The first method of picking a stock or traditional elevator cab design is usually low cost because the materials are low quality and the engineering is simple. Unfortunately, these cabs are usually unattractive and do not enhance the appearance of the building in which they are installed. Integrated elevator companies that manufacture, install and service elevators, usually have very little incentive to make their cabs attractive by the use of high-quality and decorative materials because they are selling a complete elevator package, and the look of the cab has little influence on the buyer's decision when buying a complete package.

The primary advantage of the second method, to replicate another design, is that the look and cost will be fairly well known before the contract is put to bid. This does not mean that the buyer is getting good value, because if the original is a poorly designed cab, the copy will be no better and may be quite expensive.

The third method, creating a new design, may enhance the attractiveness of a building. However, most architecturally designed cabs are very expensive because the engineering for each one is largely customized and the buying power for material is low. In addition, lead times are very long because of the need for approvals of drawings and samples, plus the acquisition time for material and the time for making shop drawings.

SUMMARY OF THE INVENTION

Applicant proposes to change the way elevator cabs are designed by providing a series of elevator cab designs of high architectural quality that are made with premium, readily available materials and pre-engineered to reduce the cost and lead time.

Applicant's advantageous design method provides for selection of attractive and advantageous designs for elevator cabs for commercial, residential and institutional buildings. Applicant supplies engineering and manufacturing expertise to guide the architectural design decisions and material selection that minimize the material and labor costs that do not directly contribute to the appearance and structural integrity of the cab.

Applicant's method will also control the product cost by choosing from a material palette of high-end products such as glass, stone, wood and textured metals in a limited range. These materials have been selected for their attractive appearance, reasonable cost and ready availability. This will maximize the buying power for acquiring these materials at the lowest costs.

Building owners will save money by getting a product that costs as much as 25% less than cabs of similar materials and design would costs. They will be given the advantage of having a superior product in their buildings that will allow them to rent space more quickly and at higher prices.

With a limited palette of materials and photo-realistic renderings of interior elevator cab design, the time-consuming project management of coordinating drawings, samples and mockups between the owner, architect and cab maker are reduced dramatically. Standard pricing and industry discounts will lock in a profit margin that does not become reduced by unforeseen extras. The lead time for the cab can be eight weeks, with as much as a 40% cut, reducing the likelihood that overtime will be needed due to scheduling conflicts.

Architects and consultants usually loose money on the cab because of the technical complexity and lengthy approval process. Now an architect and designer will be able to select with confidence from world-class designs and elegant materials.

New Method Provides a New Financing Tool by an Operating Lease

In launching this product, Applicant has found creative ways to maximize the sales volume. One new area of interest is to change the transaction for the end user from a large lump-sum capital investment into an affordable and predictable expense. By offering these cabs through an operating lease, Applicant believes that there will be a three-fold benefit to the business:

1. Expanding the base of potential customers by reducing the cost and making an attractive quality product available to building owners who lack the liquidity to pay for all this work at once.
2. Increasing the market share within this base by providing a unique alternative that may present substantial savings to the customer.
3. Raise the average selling price as customers trade up to more attractive designs and materials, because of the ability to spread the cost over time.

This invention discloses a method for drastically reducing the burden, time commitment and cost for designing, managing and installing a custom elevator cab. This method provides a way to upgrade the quality of the cab materials, design and craftsmanship and at the same time reduce the costs of an elevator cab by 33%. Real estate developers, building owners, architects, elevator companies and consultants can save time and money by ordering a custom elevator cab that could be viewed in advance and installed in only eight weeks.

The design method criteria takes into consideration the need for utilizing premium materials for the walls and ceiling without adding more than 300 pounds to the weight of the elevator cab. This method provides a solution for a cab that is 1) Innovative, 2) Custom made, 3) Time saving, 4) Easy to specify, 5) Easy to price, 6) Easy to install.

Material to be chosen include stone, wood, glass and woven wire mesh. These materials can be used in hundred of different combinations. Furthermore, using these materials allows you to complement any commercial, institutional or residential building's intrinsic design. Also, this method allows the incorporation of existing lobby materials or upgrades. This method provides affordability without compromising quality.

The cost of the average elevator cab using Applicant's design is 30% less compared to a custom design using the same material palette. This can equal a savings averaging $7,500 per cab. In addition, the design incorporates a lighter weight construction so that expensive elevator design modifications required by excess weight are eliminated.

This advantageous method of elevator cab design provides an attractive appearance complementary to a building in which the elevator is installed. The building is evaluated for determination of appropriate elevator cab interior design architecture and appearance. A suitable design is selected from a Series of previously prepared design proposal. Finally, material for the decoration of the cab interior is selected for the design from a palette of previously prepared options for available material including selection of material type, color and design. The Material Palette Option materials include wood, metal mesh, stone and glass and the material shown for selection from said palette include rectangular panel tiles. The material shown for selection from the palette for a decorative back rear panel includes a back wall panel which extends from floor to ceiling in height and extends to more than ⅓ of the width of the elevator. The remaining portion of the back rear wall of the cab is selected from rectangular panel tiles with decorative surfaces. The side walls of the cab are selected from said materials palette of rectangular panel tiles with decorative surfaces of the same design and color as the rectangular panel tiles on the back wall.

The method of elevator interior cab design includes providing the expertise of experienced designer for selecting a suitable design from a Series of design proposals for said building and providing the expertise of experienced designer for selecting the material for the decoration of the cab interior from a palette of options for available material type and color.

This method of elevator interior cab design provides expertise in elevator cab design architecture and elevator cab mechanical construction. The expertise is used to evaluate a building for determination of an appropriate elevator interior design. The expertise is used to select a suitable design from a Series of previously prepared design proposals. The expertise is than used for selecting the material for the decoration of the cab interior from a palette of options for available material type and color. This expertise is than used to construct an elevator cab interior in accordance with the design and material selected.

BRIEF DESCRIPTION OF THE DRAWINGS

FIGS. 14a to 14e illustrate further design schemes that may be selected as the desired architecture and appearance.

DETAILED DESCRIPTION OF THE INVENTION

Three Designs

There are three basic designs to select from:
1. Series 200
2. Series 300
3. Series 400

The Series 200

This design exhibits a center feature panel which aligns with a bi-level ceiling featuring both direct and indirect lighting. Complementary side wall and rear wall panels complete the elegant design. FIGS. 1 to 7 of the drawings illustrates the method shown for Series 200.

The Series 300

Figure 8:
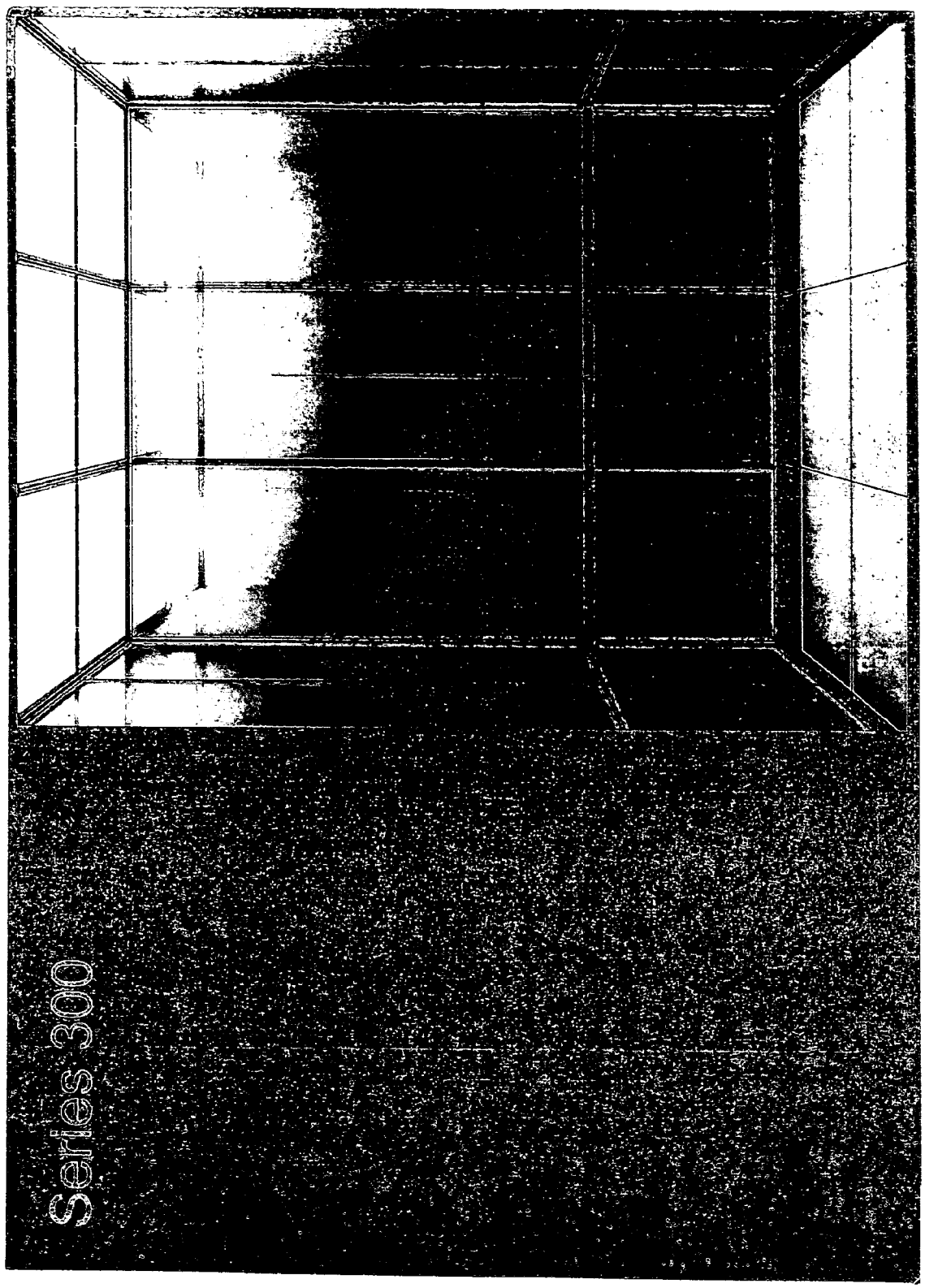
FIG. 8 is a perspective view that illustrates a Series 300 design with three large upper back panels and the three smaller lower back panels.

This paneled cab design features a traditional wainscot with the upper panels in either identical or complementary materials. The suspended ceiling is luminescent and segmented to align with the walls. FIG. 8 illustrates the Series 300 method.

The Series 400

Figure 9:
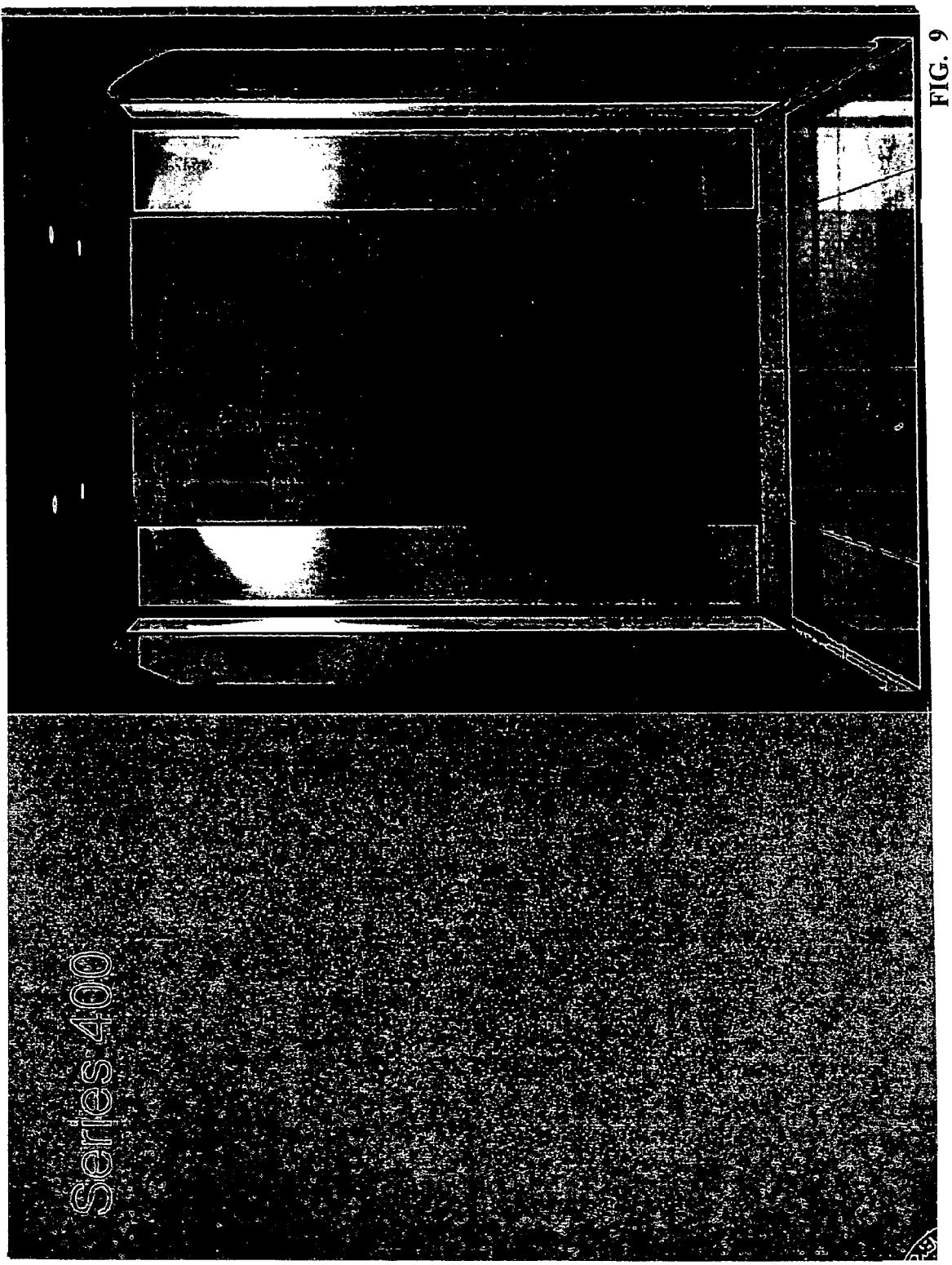
FIG. 9 is a perspective view that illustrates a Series 400 cab interior with large wood design back panels and large wood side panels extending from floor to ceiling.

This unique corner-column design is carried into the suspended ceiling. The center of the rear wall features segmented panels of complementary materials. The top of the wall panels are defined by an elegant metal grill. The cab is lit by halogen downlights mounted on a suspended ceiling. FIG. 9 illustrates the design method for Series 400.

The Design

By utilizing the designs we have created, the client reduces the design phase by eliminating the need for concept drawings, models and design review. This savings translates not only in shorter time frames, but fewer design hours and lower costs.

Building owners will benefit by participating in the selection and specification of designs because the process is transparent and easy to grasp.

The Selection/Purchase Process

A simplified ordering process will yield a quotation in 24 hours. A full color presentation is available within one week.

| Wall Panel Material Options | |
|---|---|
| Material A | Material B |
| Glass | Glass |
| Glass | Stone |
| Glass | Mesh |
| Stone | Glass |
| Stone | Stone |
| Stone | Mesh |
| Mesh | Glass |
| Mesh | Stone |
| Mesh | Mesh |

Figure 10:
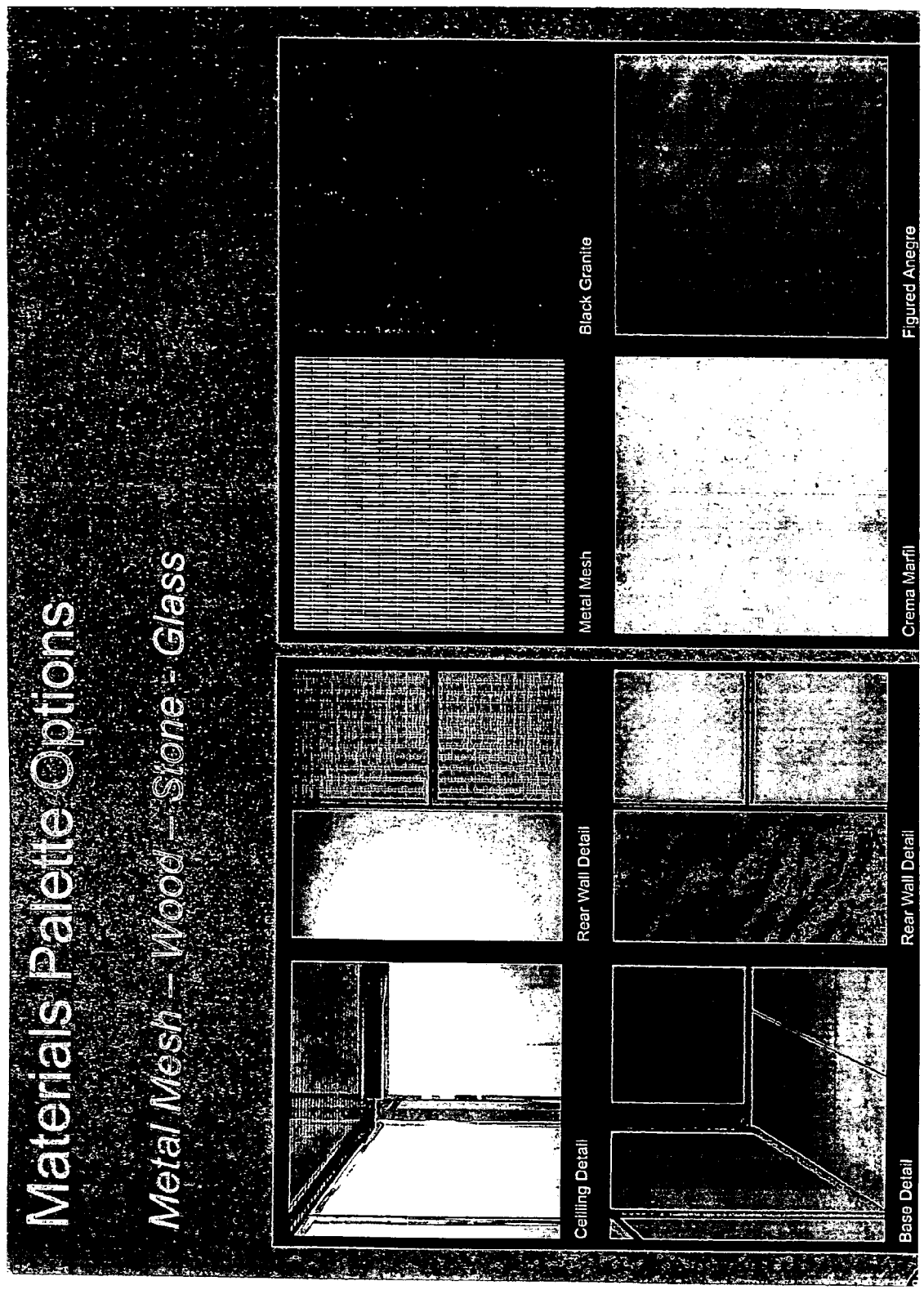
FIG. 10 illustrates a Materials Palette Options Selection display.

FIG. 10 illustrates the method for the selection of these materials.

Figure 1:
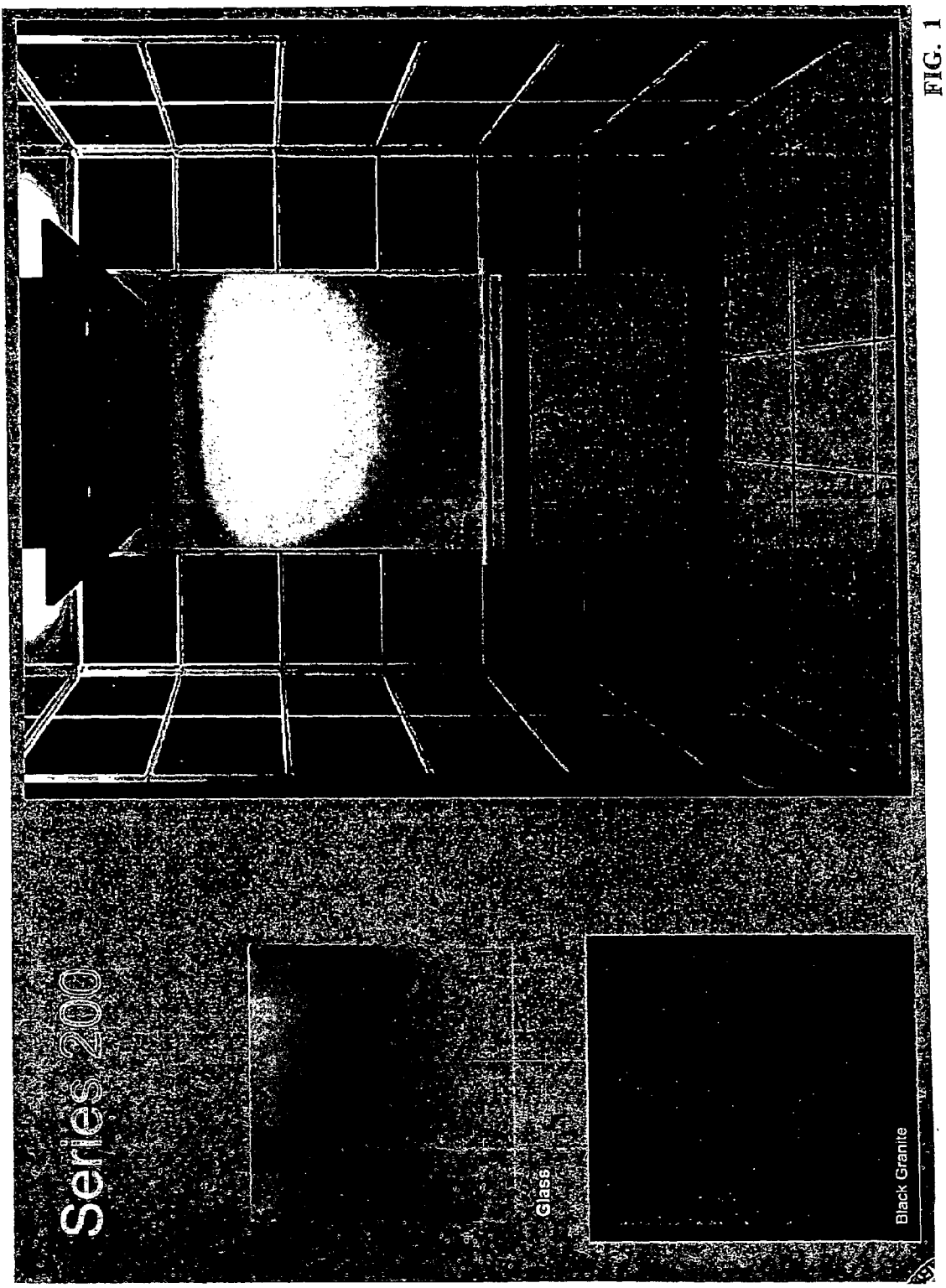
FIG. 1 is a perspective view that illustrates a Series 200 elevator interior design where glass is used for the back wall panel.

As shown in FIG. 1, the 200 Series design includes an interior back wall panel 1 for the elevator cab. This panel 1 extends from floor 2 to ceiling 3. The width of the back wall panel is such that it extends to more than ½ of the width of the back wall. On either side of the back wall panel are six (6) square panel tile vertical rows that run from floor to ceiling to complete the decoration of the back wall. The two side walls as shown in FIG. 1 are also made of the same square panel tiles with vertical rows of six panel tiles extending from the floor to the ceiling. The vertical rows of panel tiles extend along the width of the side walls 5 and 6 of the elevator cab. As shown in FIG. 1 the back wall panel is made up of glass panel 7a and square panel tiles are made of black granite squares 8a.

Figure 2:
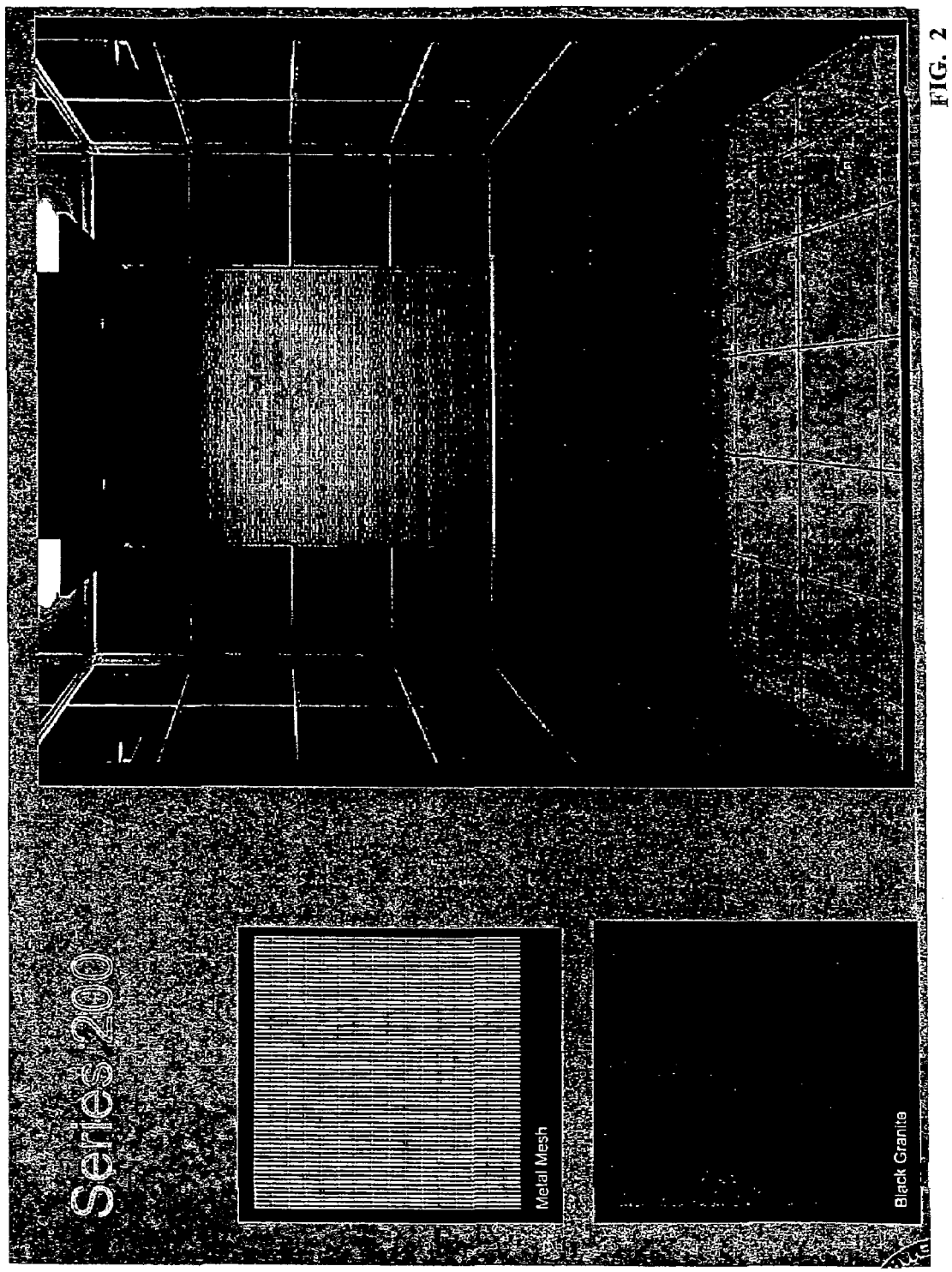
FIG. 2 is a perspective view that illustrates Series 200 elevator cab where metal mesh is used for the back wall panel.

In FIG. 2 there is another decorative design scheme for Series 200 with different materials selected from the Materials Palette Options of FIG. 10. Here the back wall panel is made of metal mesh 10 and the side panel tiles are made of black granite 8b.

Figure 3:
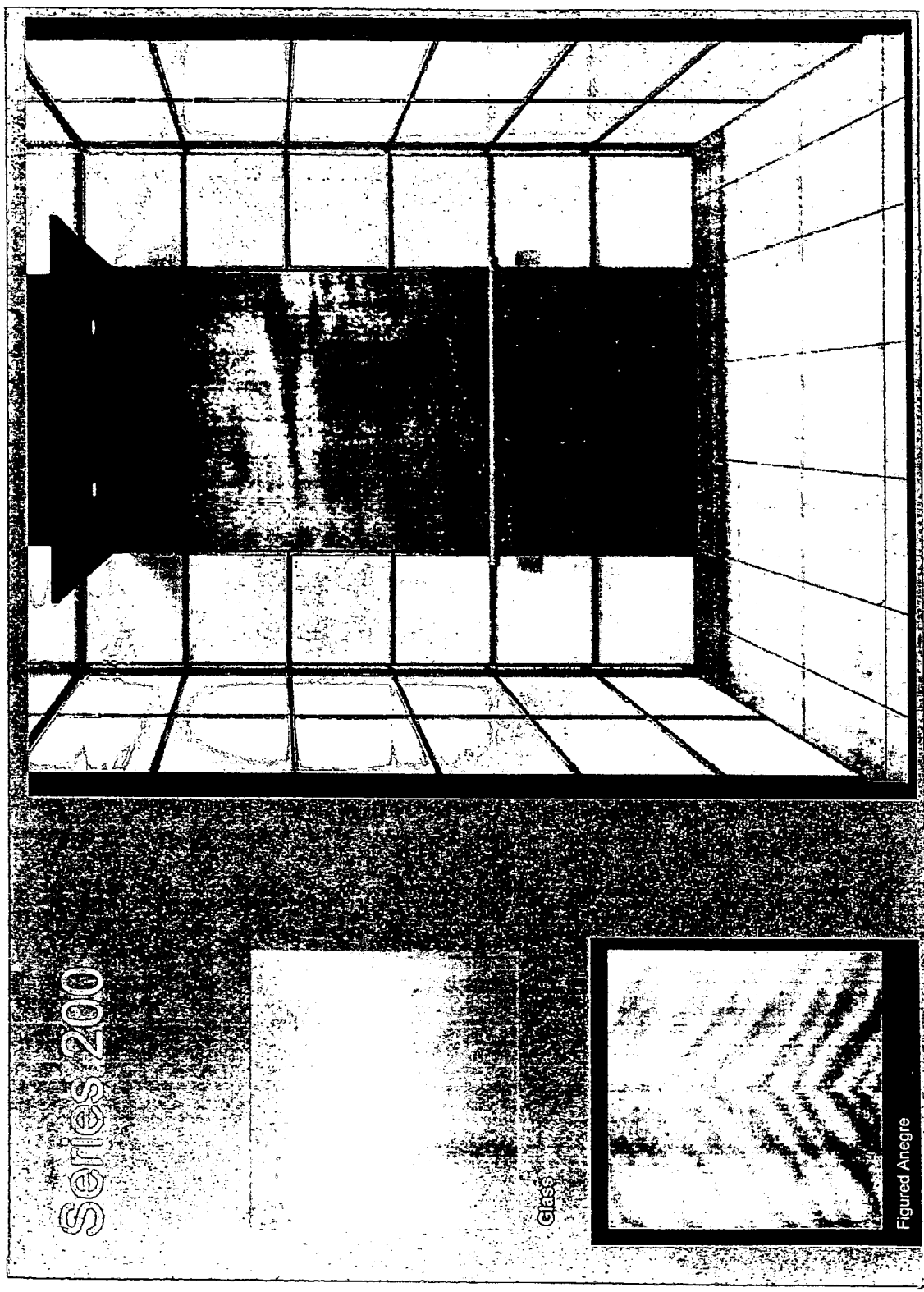
FIG. 3 is a perspective view that illustrates a Series 200 elevator cab interior where a Figured Anegre wood design is used for the back panel.

In FIG. 3 Series 200 design with a back panel made of Figured Anegre wood design 11 and tile panels 4 made of glass 7 have been selected from the Materials Palette Options of FIG. 10.

Figure 4:
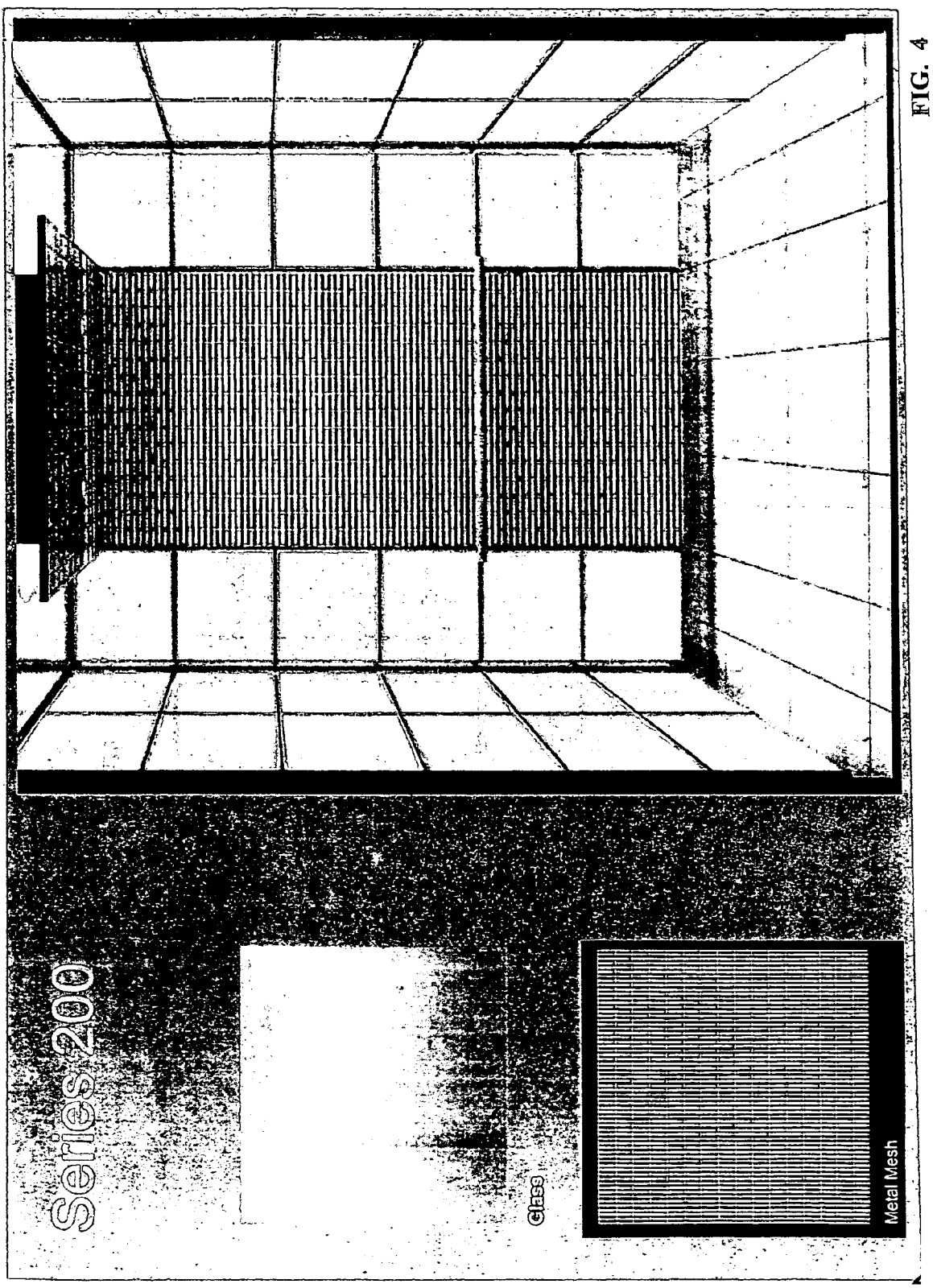
FIG. 4 is a perspective view that illustrates a Series 200 design where metal mesh is used for the back wall panel and glass rectangular panel tiles on the back and side walls.

FIG. 4 is a Series 200 design with a back panel made of metal mesh 10. The panel tiles 4 are made of glass 7.

Figure 5:
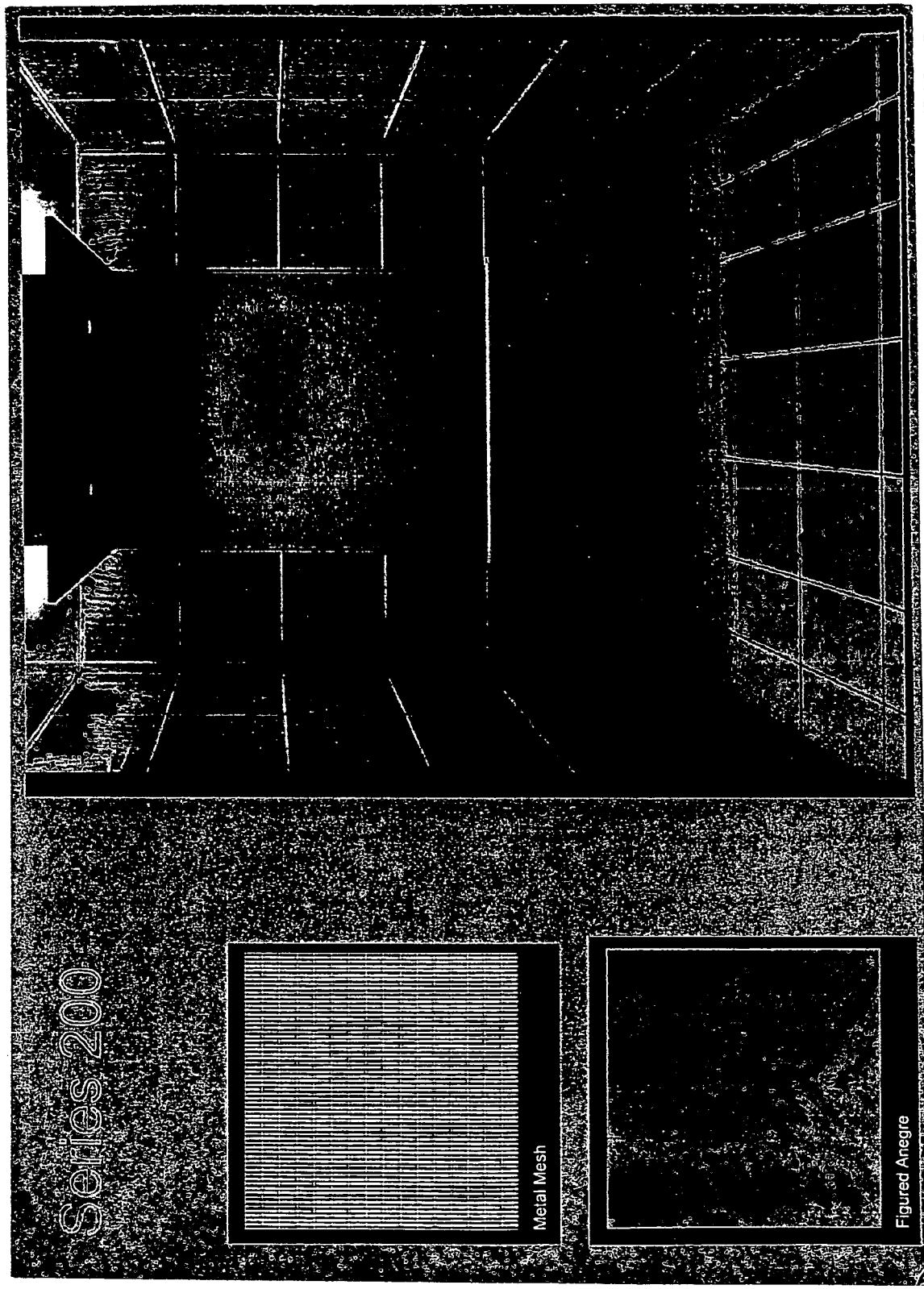
FIG. 5 is a perspective view that illustrates a Series 200 design where metal mesh is used for the back wall panel and rectangular panel tiles of Figured Anegre wood design are used for the back and side walls.
Figure 6:
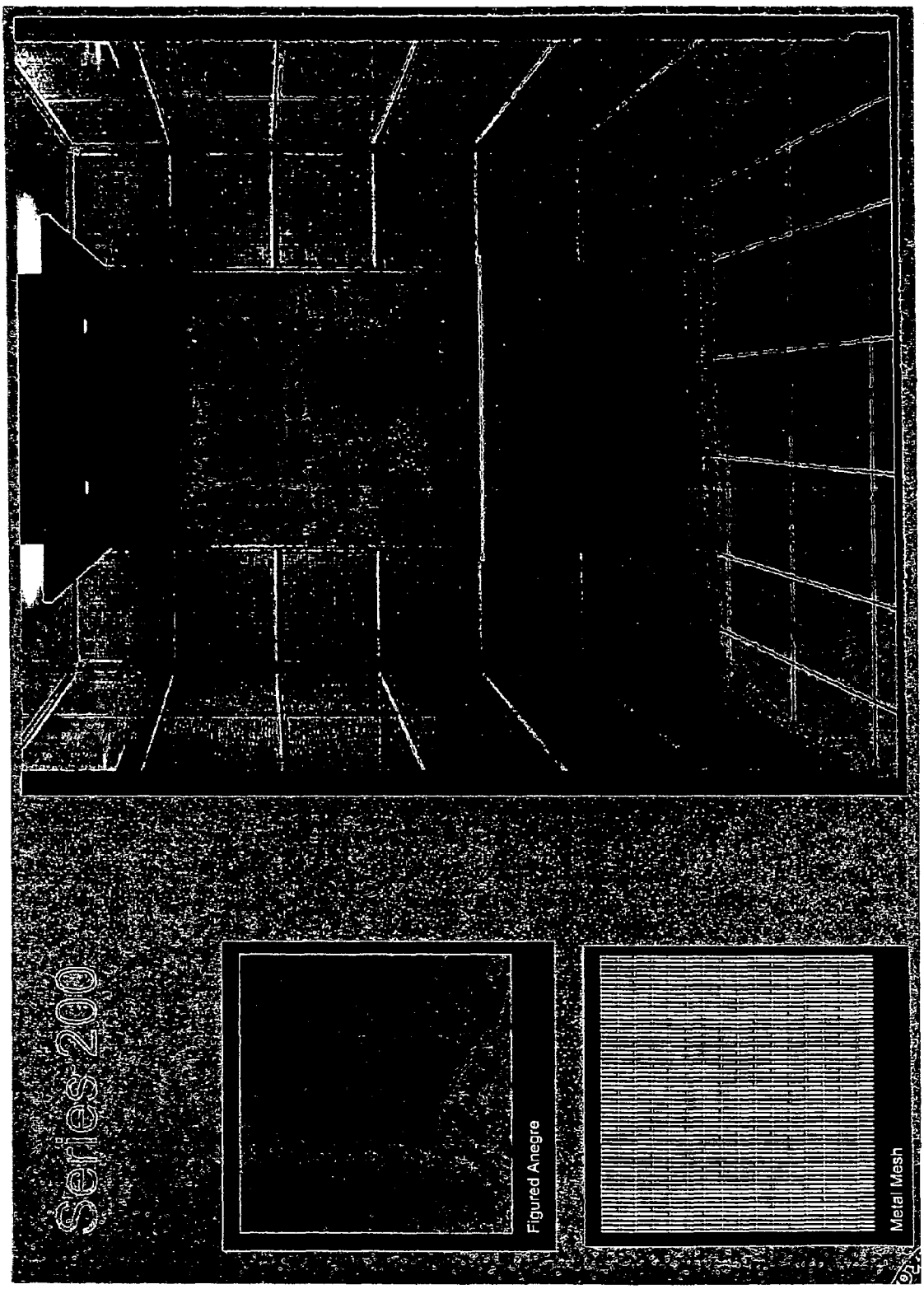
FIG. 6 is a perspective view that illustrates a Series 200 design where Figured Anegre wood design is used for the back panel with side rectangular panel tiles of metal mesh.

Similarly FIG. 5 is Series 200 design with metal mesh 10, back panel but with the square panel tiles made of Figured Anegre wood design 11. In contrast FIG. 6 discloses a Series 200 design with a back panel made of Figured Anegre wood design 11 and the square panel tiles made of metal mesh 10.

Figure 7:
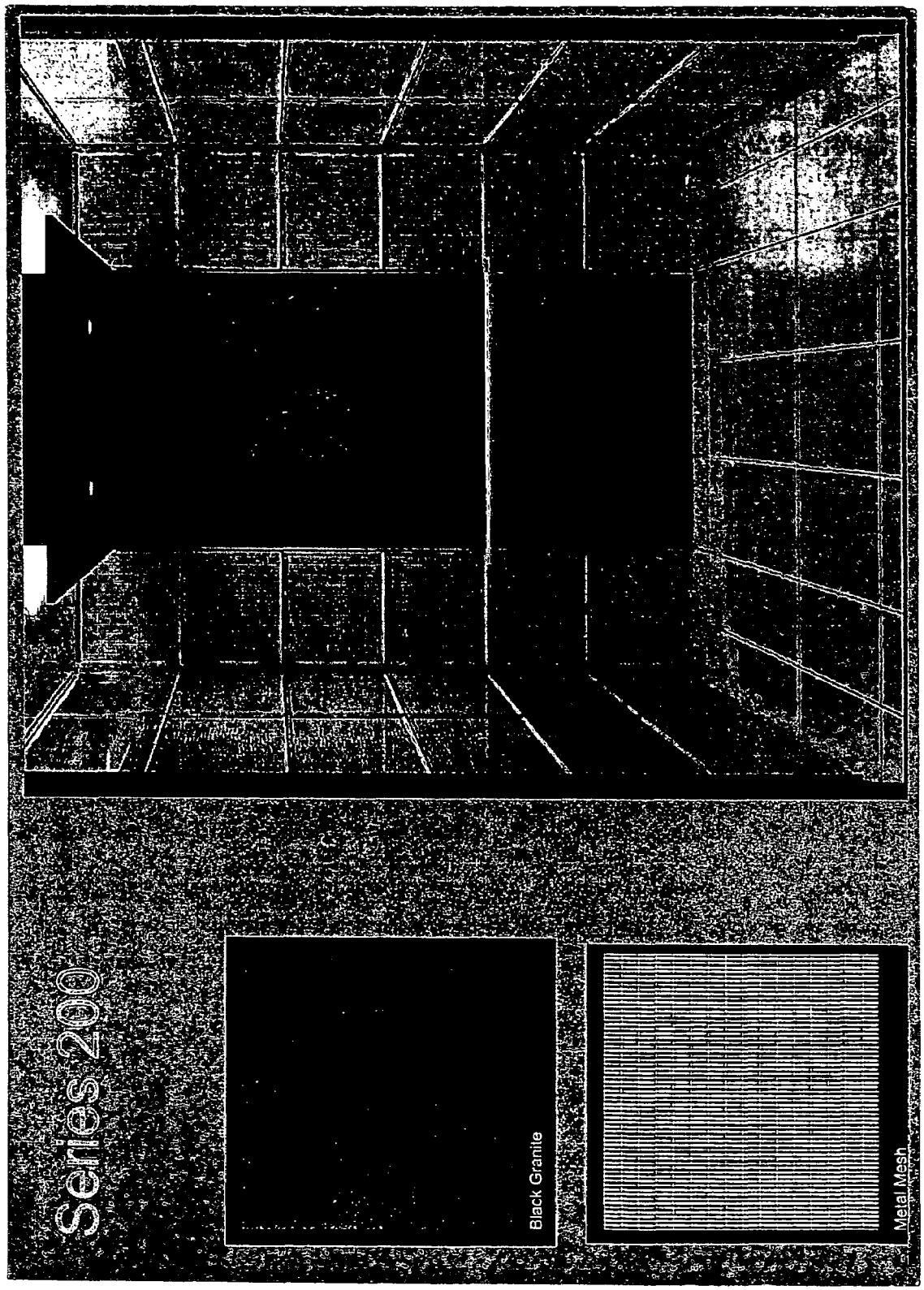
FIG. 7 is a perspective view that illustrates a Series 200 design elevator cab interior with black granite back panel and rectangular side panel tiles of metal mesh.

Another variation of a Series 200 is shown in FIG. 7 which illustrates a design with black granite 8 back panel and metal mesh 10 square tile material.

FIG. 8 is a perspective view that discloses a Series 300 interior cab design with a six (6) back wall panel having upper three rectangular panel 12a which extend from the ceiling to approximately ⅔ down from the height of the cab and three square lower panel 12b that extend from the floor to the upper panels 12. A mullion 12c separates the upper and lower back panel 12a and 12b. The side walls are similarly constructed. The panels are made of glass 13.

FIG. 9 is a perspective view of a Series 400 interior cab design with large vertical wooden panels 14 on the back wall extending approximately ⅔ of the width of the rear wall. On either side of the back panels 14 are elongated end panels 15 and 16 which may be made of mirror or glass extending from floor to ceiling. There is a hand railing located on the back wall. The side wall designs are identical to the back wall so that each back corner appears as a column of glass.

Figure 11:
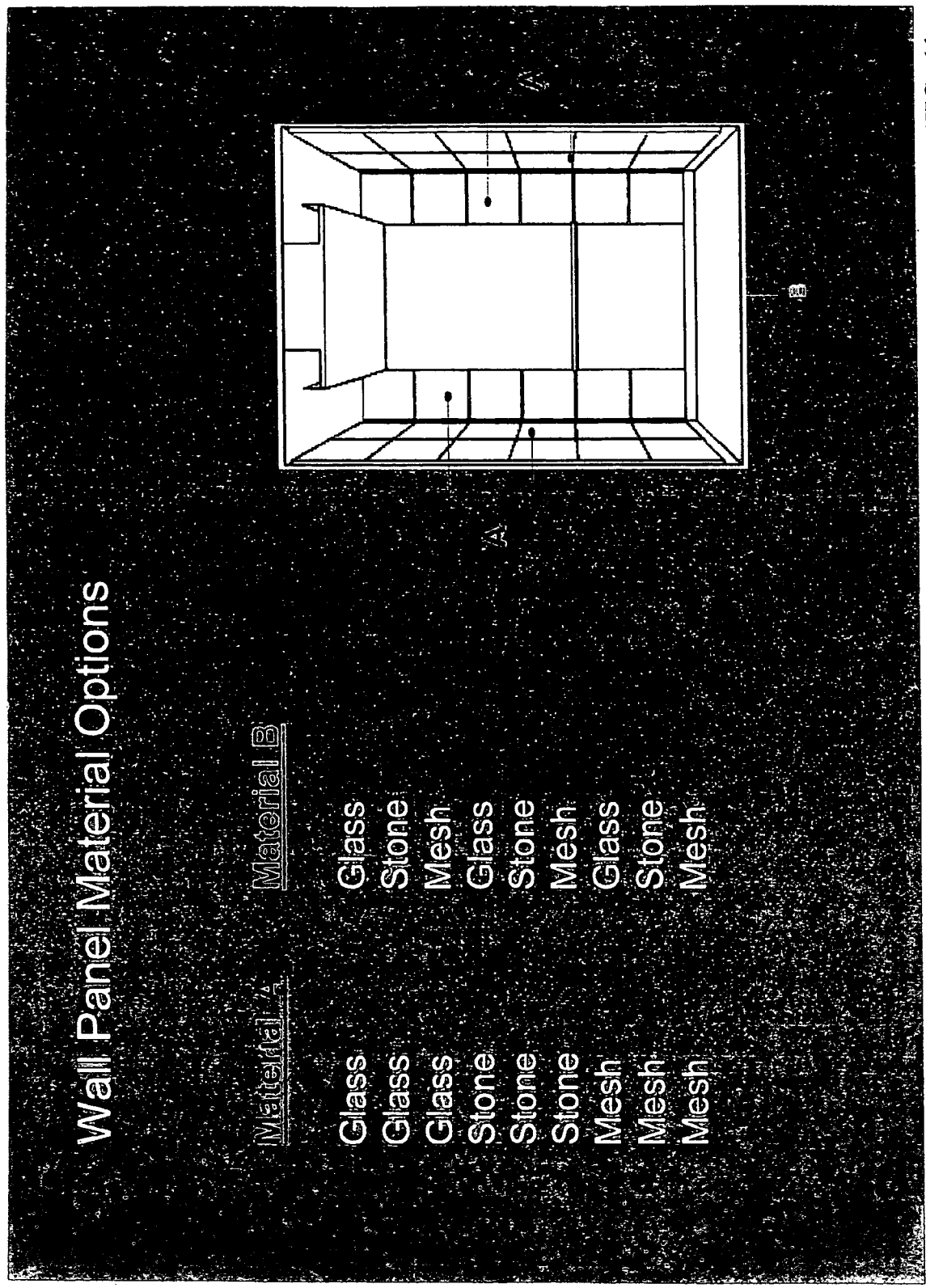
FIG. 11 illustrates a Wall Panel Material Options Guide.

FIG. 10 illustrates a Palette Options where the user can select a material such as wood, metal mesh, stone and glass panel for use in one of the previously selected designs. FIG. 10 also shows the rear wall detail and ceiling and base construction detail that can be selected as an option with a selected design. FIG. 11 shows the wall panel material chart showing various materials that can be used for the 200 Series such as glass, stone, metal mesh and wood.

Figure 12:
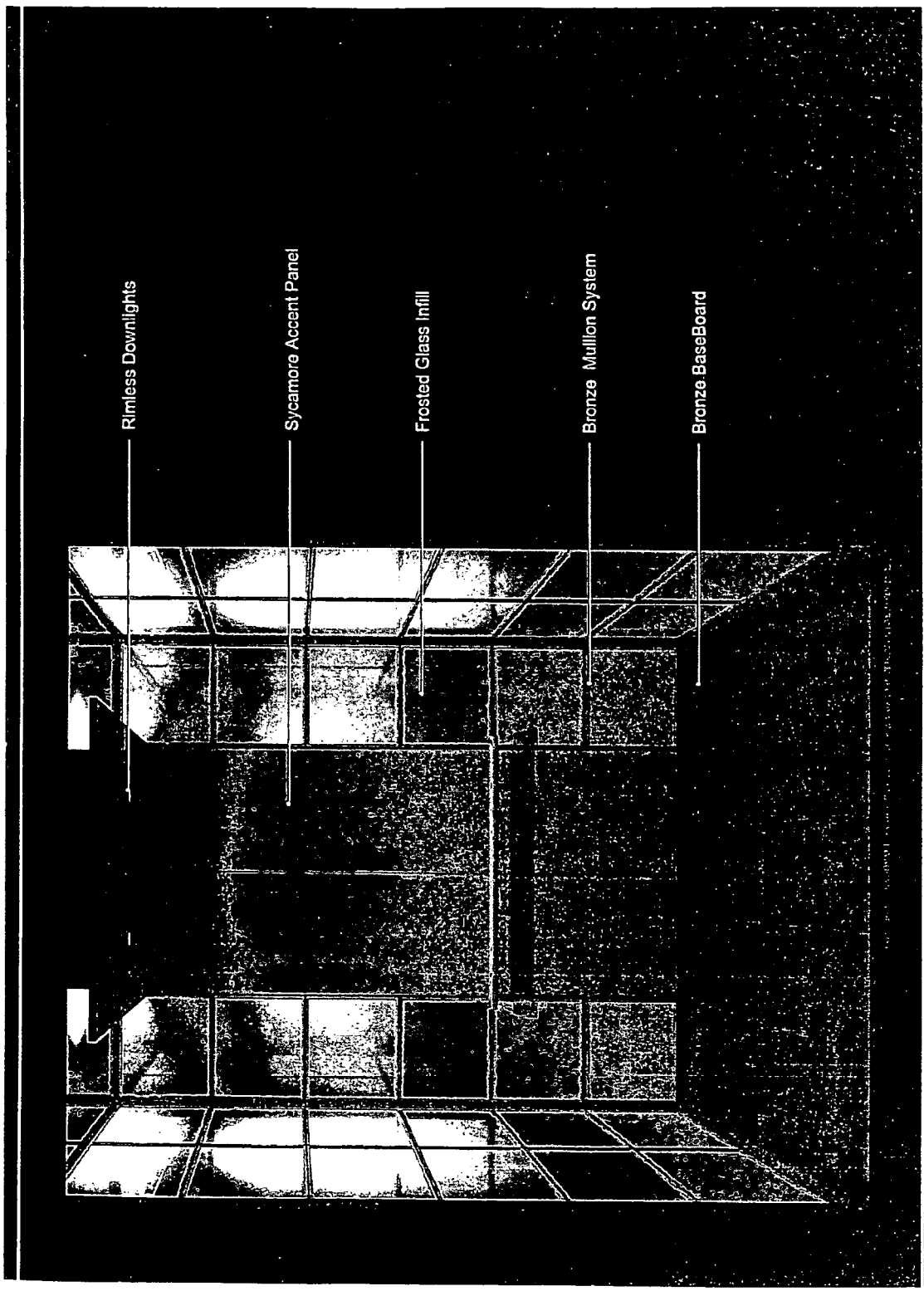
FIG. 12 is a perspective view that illustrates another Series 200 design which includes a bronze mullion and baseboard.
Figure 13:
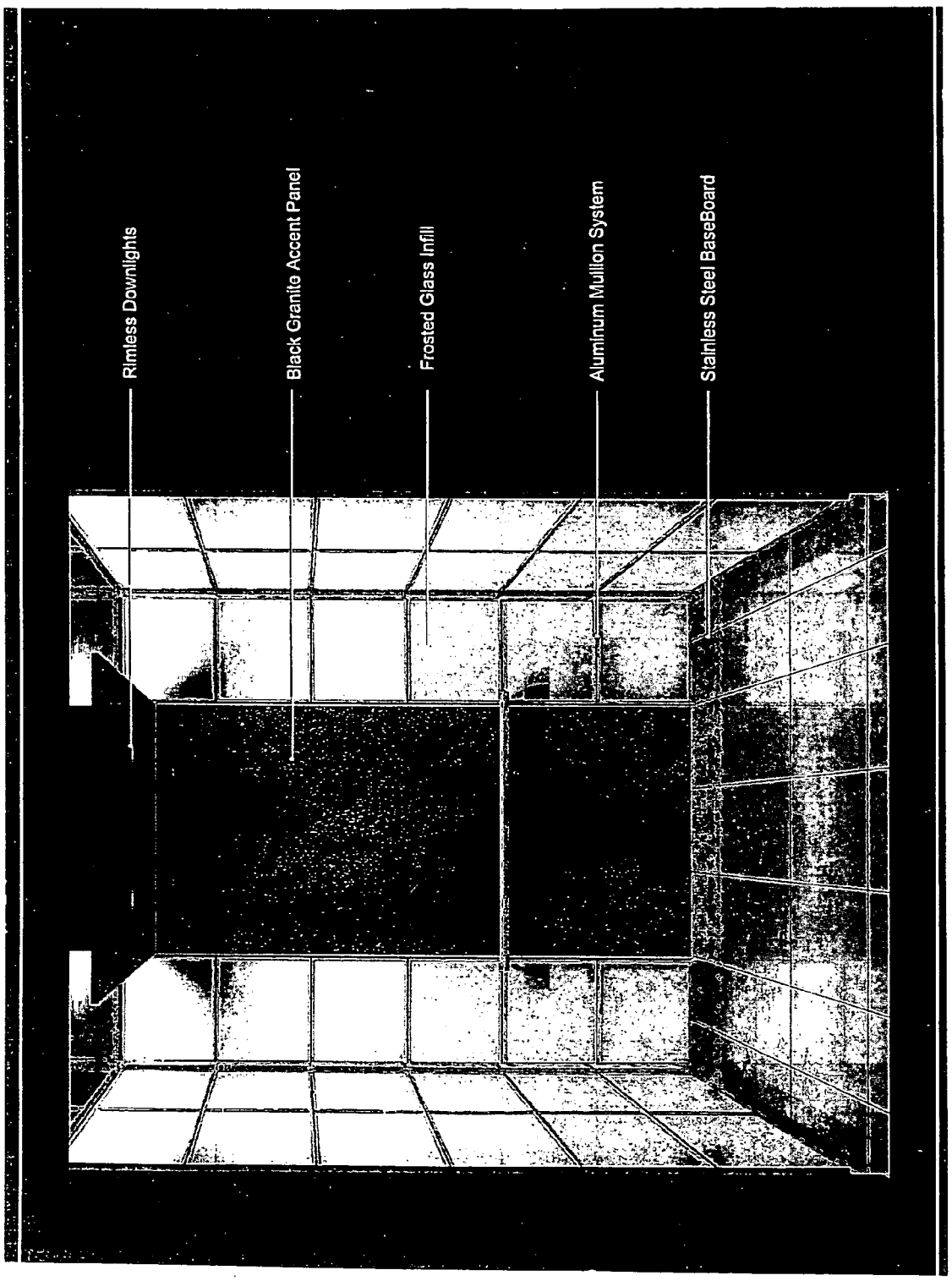
FIG. 13 is a perspective view that illustrates a further Series 200 design which includes an aluminum mullion and stainless steel baseboard.
Figure 14A:
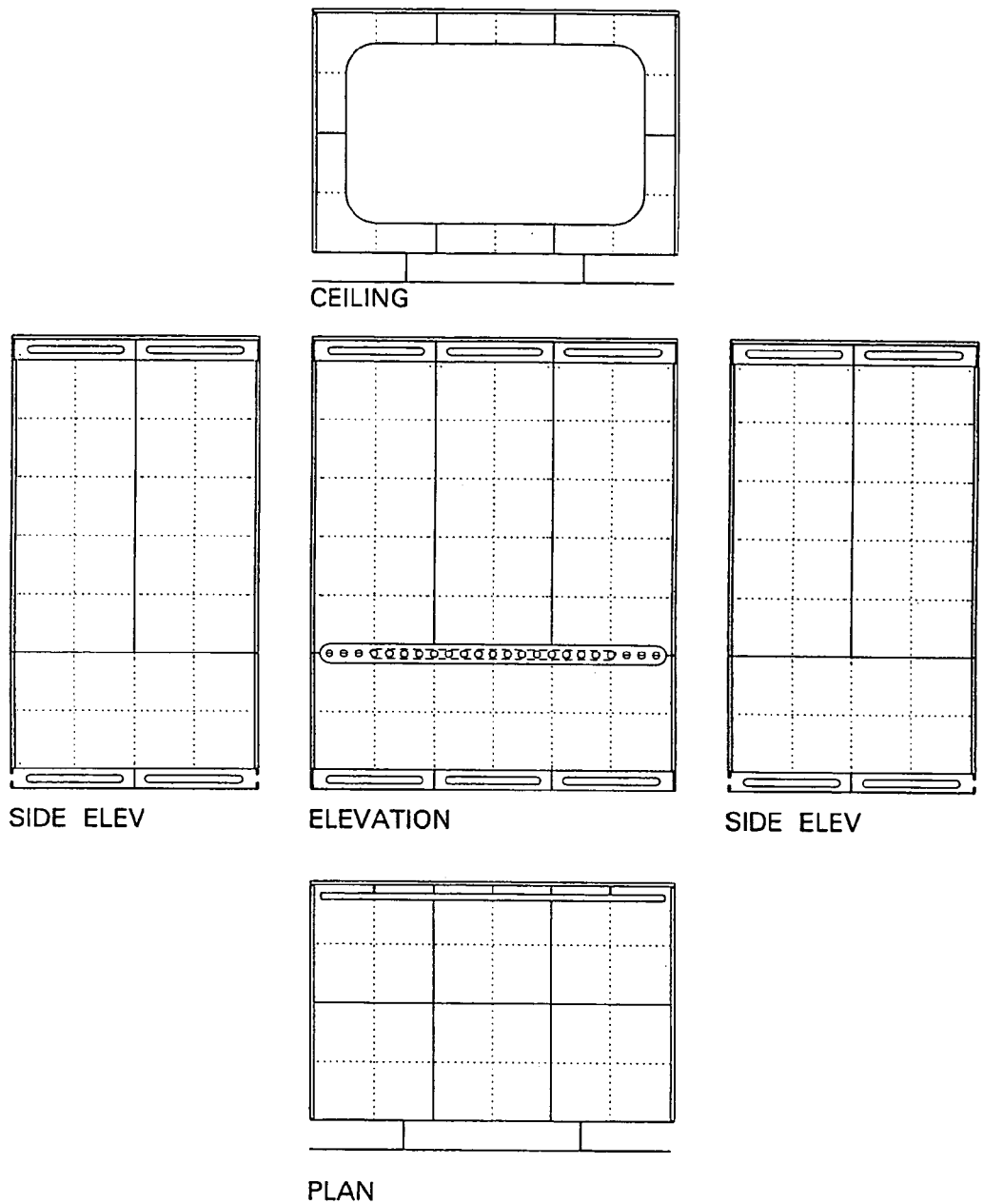
Figure 14B:
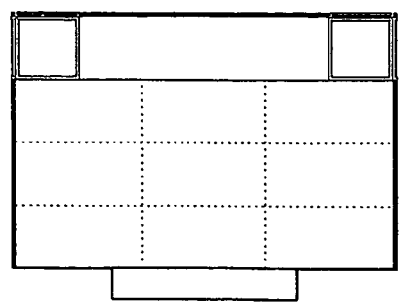
Figure 14B:
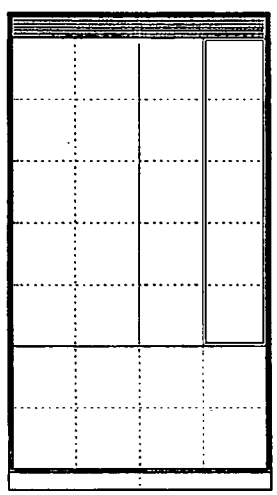
Figure 14B:
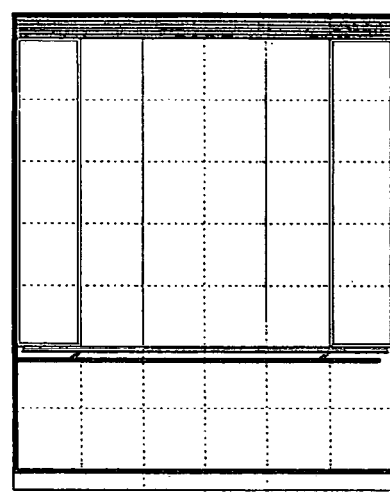
Figure 14B:
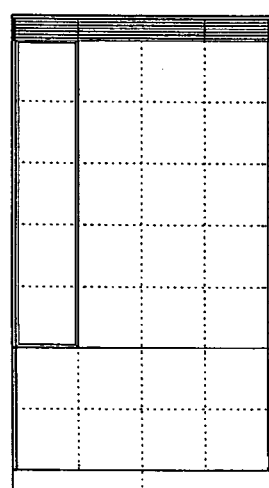
Figure 14B:
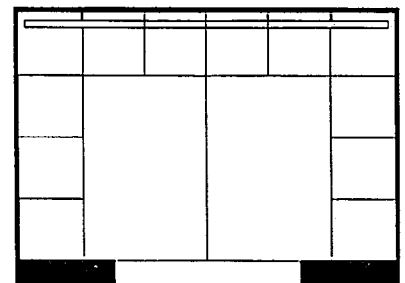
Figure 14E:
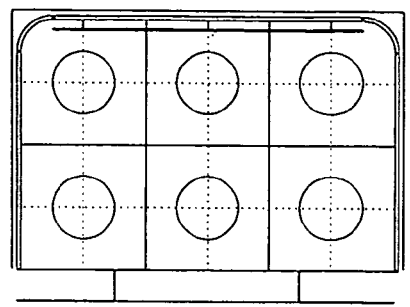
Figure 14E:
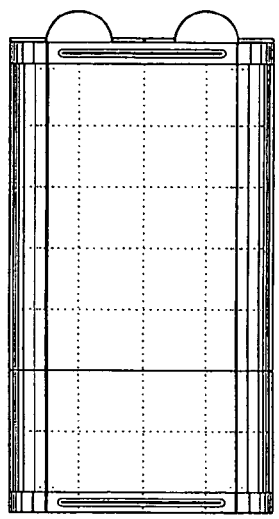
Figure 14E:
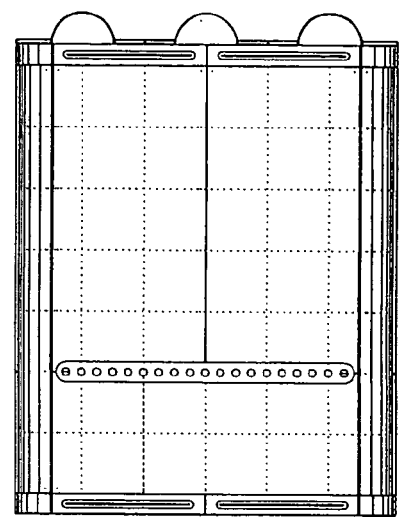
Figure 14E:
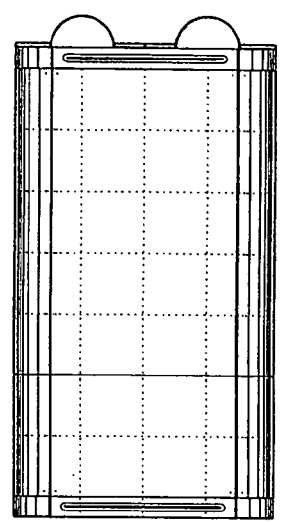
Figure 14E:
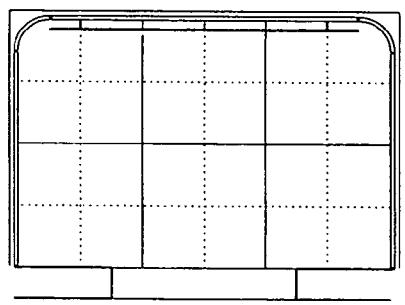

FIG. 12 discloses another 200 design which uses attractive bronze mullion and bronze base board along with rimless downlights. The back panel is made of sycamore accent combined with frosted glass panel tiles. FIG. 13 illustrates another variation on the 200 Series with aluminum mullions and stainless steel baseboards. Here the elevator cab is decorated by black granite back panel and square frosted tile panels.

FIG. 14a through 14d show the various configurations that may be selected for an appropriate, attractive design for the elevator cab interior.

Example of Use of Series 300

Custom designed and constructed cab by world class architects exceeded budget and weight by 50% and lead time by an additional eight weeks. Working with the customer, the Applicant used the design method to incorporate the custom approved color palette into the Series 200 design. The new design was under budget and weight restrictions and within the required lead time. It took two weeks from the initial meeting for redesign and approval.

Sample of Use of 300 Series

Major institutional property owner had not hired architect to design the cab.

Problem

Wanted high quality cab completed in four months.

Solution

Working from the Applicant's design method catalog the customer found the appropriate design from the illustrations of FIGS. 7 and 8 that suited their building. In addition they picked out the metal, wood, stone and glass for the design from the Materials Palette Options. Within two weeks from the initial meeting a design was selected.

SAMPLE USE OF THE 400 SERIES DESIGN

Major institutional property owner sought to upgrade an unpleasant looking elevator interior.

Problem

Although approved, the initial design did not proceed due to budget constraints with the building.

Solution

Two years later, Applicant's method was introduced and a Series 400 design was selected. Material was selected from the Material palette. The original budget was lowered by $7,300 per cab

EXAMPLE

A building owner hired an 1,800-person architecture and interior design firm to do a visual modernization of the six passenger elevators in this prime Eastern large city property.

The architect's design was put out for bid. Applicant's bid, which was competitive, was for more than $30,000 per cab with a manufacturing lead time of 16 weeks. The design by the architect also added more than 500 pounds to the weight of the cab, which would require an expensive re-balancing of the counterweights by the elevator company.

Applicant than introduced the building owner to its design method using Designer Series 200 cab designs. Using the same primary materials and finishes as the architect, Applicant was able to provide a cab priced at less than $25,000, with a manufacturing lead time of 8 weeks while adding less than 300 pounds to the weight of the elevator cab, thereby avoiding a re-balancing. It took the owner and Applicant only one face-to-face meeting and less than two weeks to select and approve the interior design for the cabs.

EXAMPLE

In early September, a building owner of an upscale suburban office building decided to go ahead with a visual modernization of six passenger elevator cabs. However, they only had until the end of December to complete the entire project due to capital budget requirements. Normally, selecting an architect, designing the cabs and putting them out to bid would be a 3–4 month project. With the need for 14–16 weeks for an elevator cab company to submit drawings for approval, then manufacture and install the product, the building owner was out of time for such a traditional approach.

Applicant presented the building management with its design method using the Designer Series 200 cab designs. A half-day survey of the existing cabs determined that a Series 200 cab would fit without a problem The building management was able to select stock materials from the Applicant's material palette and get a quote and photo-quality rendering of their design within a week. The building owner approved the project within a week so that their cabs could be installed before the end of the year.

EXAMPLE

For more than three years, a building owner struggled to find an acceptable plan to visually modernize the 23 passenger elevators in a classic "cathedral of commerce" style building. The existing cabs were done in an unpleasant plastic laminate design that was entirely inappropriate. Despite a number of design attempts using both in-house and outside professionals, the building owner was unable to come up with a design that was architecturally attractive while still keeping the overall cost down. Applicant had worked with the building owner all along the way but only as a cab manufacturer and therefore could only provide reasons.

Finally, Applicant unveiled its design method to the building owner a design and its Designer Series 200 cab design to senior management of the building owner. In just two meetings, the building owner selected materials and approved the project at just over $20,000 per cab, well within the budget for this building.

1 Back Wall Panel
1*d* Back Panel
2 Floor
3 Ceiling
4 Square Panel Tiles
5 Side Wall
6 Side Wall
7 Glass Tile
8 Black Granite
10 Metal Mesh
11 Figured Anegre Wood Design
12*a* Upper Back Panels
12*b* Lower Back Panels
12*c* Mullion
13 Mirror
14 Back Panels of 19
15 End Panels
16 End Panels of 14

We claim:

1. A method of elevator cab design for providing an attractive appearance complementary to a building in which the elevator is installed including:
    a) Evaluating a building for determination of appropriate elevator cab interior design architecture appearance;
    b) Selecting a suitable design from a Series of previously prepared Design proposals;
    c) Selecting material for the decoration of the cab interior for the design selected from a palette of previously prepared options for available material including selection of material type, color and design; and
    d) constructing the elevator cab interior in accordance with the design and material.

2. The design method of claim 1 wherein the Material Palette Option materials include wood, metal mesh, stone and glass.

3. The design method of claim 2 wherein the material shown for selection from said palette include rectangular panel tiles.

4. The design method claim 3 wherein the material shown for selection from said palette for a decorative back rear panel includes a back wall panel which extends from floor to ceiling in height and extends to more than ⅓ of the width of the elevator.

5. The design method of claim 4 wherein the remaining portion of the back rear wall of the cab is selected from rectangular panel tiles with decorative surfaces.

6. The design method of claim 5 wherein the side walls of the cab are selected from said materials palette of rectangular panel tiles with decorative surfaces of the same design and color as the rectangular panel tiles on the back wall.

7. A method of elevator interior cab design including:
    a) Evaluating a building for determination of an appropriate elevator interior design;
    b) Providing the expertise of experienced designer for selecting a suitable design from a Series of previously prepared design proposals for said building;
    c) Providing the expertise of experienced designer for selecting the material for the decoration of the cab interior from a palette of options for available material type and color;
    d) Constructing the elevator cab interior in accordance with the design and material selected.

8. The design method of claim 7 wherein the Material Palette Option materials include wood, metal mesh, stone and glass.

9. The design method of claim 8 wherein the material shown for selection from the palette includes rectangular panel tiles.

10. The design method claim 9 wherein a decorative back rear panel is selected from said design proposals for the back wall which extends from floor to ceiling in height and extends to more than ⅓ of the width of the elevator.

11. The design method of claim 10 wherein the remaining portion of the back rear wall of the cab is selected from rectangular panel tiles with decorative surfaces.

12. The design method of claim 11 wherein the side walls of the cab are selected from said material palette of rectangular panels with decorative surfaces of the same design and color as the rectangular panels on the back wall.

13. A method of elevator interior cab design including:
a) Providing expertise in elevator cab design architecture and elevator cab mechanical construction;
b) Evaluating a building with said expertise for determination of an appropriate elevator interior design;
c) Using said expertise for selecting a suitable design from a Series of previously prepared design proposals for said building;
d) Using said expertise for selecting the material for the decoration of the cab interior from a palette of options for available material type and color;
e) Constructing elevator cab interior in accordance with the design and material selected.

14. The design method of claim 13 wherein the Material Palette Option materials include wood, metal mesh, stone and glass.

15. The design method of claim 14 wherein the material shown for selection from the palette includes rectangular panel tiles.

16. The design method claim 15 wherein a decorative back rear panel is selected from said design proposals for the back wall which extends from floor to ceiling in height and extends to more than ⅓ of the width of the elevator.

17. The design method of claim 16 wherein the remaining portion of the back rear wall of the cab is selected from rectangular panel tiles with decorative surfaces.

18. The design method of claim 17 wherein the side walls of the cab are selected from said material palette of rectangular panels with decorative surfaces of the same design and color as the rectangular panels on the back wall.

* * * * *